(12) United States Patent
Ritchie

(10) Patent No.: US 7,389,645 B2
(45) Date of Patent: Jun. 24, 2008

(54) RADIATION SHIELD FOR CRYOGENIC PUMP FOR HIGH TEMPERATURE PHYSICAL VAPOR DEPOSITION

(75) Inventor: Alan A. Ritchie, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 356 days.

(21) Appl. No.: 11/267,058

(22) Filed: Nov. 4, 2005

(65) Prior Publication Data

US 2007/0101733 A1     May 10, 2007

(51) Int. Cl.
B01D 8/00 (2006.01)
(52) U.S. Cl. ...................................................... 62/55.5
(58) Field of Classification Search .................. 62/55.5
See application file for complete search history.

(56) References Cited

U.S. PATENT DOCUMENTS

| | | | | |
|---|---|---|---|---|
| 4,267,707 | A * | 5/1981 | Hemmerich | 62/55.5 |
| 4,446,702 | A * | 5/1984 | Peterson et al. | 62/55.5 |
| 5,366,002 | A | 11/1994 | Tepman | |
| 5,467,220 | A | 11/1995 | Xu | |
| 5,782,096 | A * | 7/1998 | Bartlett et al. | 62/55.5 |
| 6,223,540 | B1 * | 5/2001 | Egermeier | 62/55.5 |
| 6,263,679 | B1 * | 7/2001 | Paynting | 62/55.5 |
| 6,436,267 | B1 | 8/2002 | Carl et al. | |
| 6,627,056 | B2 | 9/2003 | Wang et al. | |
| 6,660,135 | B2 | 12/2003 | Yu et al. | |
| 6,890,403 | B2 | 5/2005 | Cheung et al. | |
| 7,037,083 | B2 * | 5/2006 | O'Neil et al. | 417/53 |
| 2002/0015855 | A1 * | 2/2002 | Sajoto et al. | 428/639 |
| 2005/0136691 | A1 | 6/2005 | Le et al. | |
| 2005/0183669 | A1 | 8/2005 | Parkhe et al. | |

OTHER PUBLICATIONS

Le, Hienminh, et al., U.S. Patent Application entitled, "Method for Adjusting Electrochemical Field Across a Front Side of a Sputtering Target Disposed Inside a Chamber" filed Jun. 27, 2005, U.S. Appl. No. 11/167,520.

* cited by examiner

Primary Examiner—William C Doerrler
(74) Attorney, Agent, or Firm—Patterson & Sheridan, LLP

(57) ABSTRACT

A method and apparatus to shield a cryogenic pump in a physical vapor deposition chamber comprising a physical vapor deposition chamber, a gasket in thermal contact with the physical vapor deposition chamber, at least one post in contact with the gasket, a radiation shield connected at the top of the post, and at least one intermediate ring in contact with the post. A method and apparatus for a radiation shield for a cryogenic pump comprising a cryogenic pump with a region upstream from the cryogenic pump, a gasket in thermal contact the region upstream from the cryogenic pump, at least one post in contact with the gasket, a radiation shield connected at the top of the post, and at least one intermediate ring in contact with the post.

16 Claims, 6 Drawing Sheets

RADIATION SHIELD FOR CRYOGENIC PUMP FOR HIGH TEMPERATURE PHYSICAL VAPOR DEPOSITION

BACKGROUND OF THE INVENTION

1. Field of the Invention

Embodiments of the present invention generally relate to method and apparatus for semiconductor substrate processing. More specifically, embodiments of the present invention relate to methods and apparatus for physical vapor deposition.

2. Description of the Related Art

Physical vapor deposition is performed in chambers at low pressure and high temperature. To provide low pressure environments such as $5*10^{-8}$ Torr or less for ultra high vacuum (UHV), pumping systems are selected with optimum efficiency. A cryogenic pump is often selected to provide high gas pumping speeds. A first stage of the pump is maintained at 60-100K and the second stage is maintained at a lower temperature, around 13K. When the PVD chamber is cleaned or other maintenance is performed, water is adsorbed on the internal chamber surfaces. As the chamber gases are pumped out of the chamber, the rate of pressure drop decreases as the evaporation and removal of water adsorbed on the chamber surfaces becomes the determining rate step in the evacuation of the chamber. To achieve UHV within an acceptable time period, the chamber is heated with infrared (IR) lamps. The IR energy heats the internal surfaces and energizes the water molecules to break the weak water-water bonds and desorb. This bake out process helps obtain a chamber pressure of $5*10^{-8}$ Torr within hours.

This relatively fast chamber bake out requires an IR energy input in the range of tens of $mW/cm^2$. The cryogenic pump is not as effective (its surface temperature rises) if exposed to energy greater than about 50 W. Water that has adsorbed on the pump surface may even reach vapor pressure and release back into the chamber. Protection of the cryogenic pump assembly is needed to protect the cryogenic pump, prevent trapped gas volumes, provide limited down time for cleaning and maintenance, and require low cost manufacturing and installation or retrofit.

SUMMARY OF THE INVENTION

The present invention generally provides a method and apparatus to shield a cryogenic pump in a physical vapor deposition chamber comprising a physical vapor deposition chamber, a gasket in thermal contact with the physical vapor deposition chamber, at least one post in contact with the gasket, a radiation shield connected at the top of the post, and at least one intermediate ring in contact with the post. The present invention also generally provides a method and apparatus for a radiation shield for a cryogenic pump comprising a cryogenic pump with a region upstream from the cryogenic pump, a gasket in thermal contact the region upstream from the cryogenic pump, at least one post in contact with the gasket, a radiation shield connected at the top of the post, and at least one intermediate ring in contact with the post.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
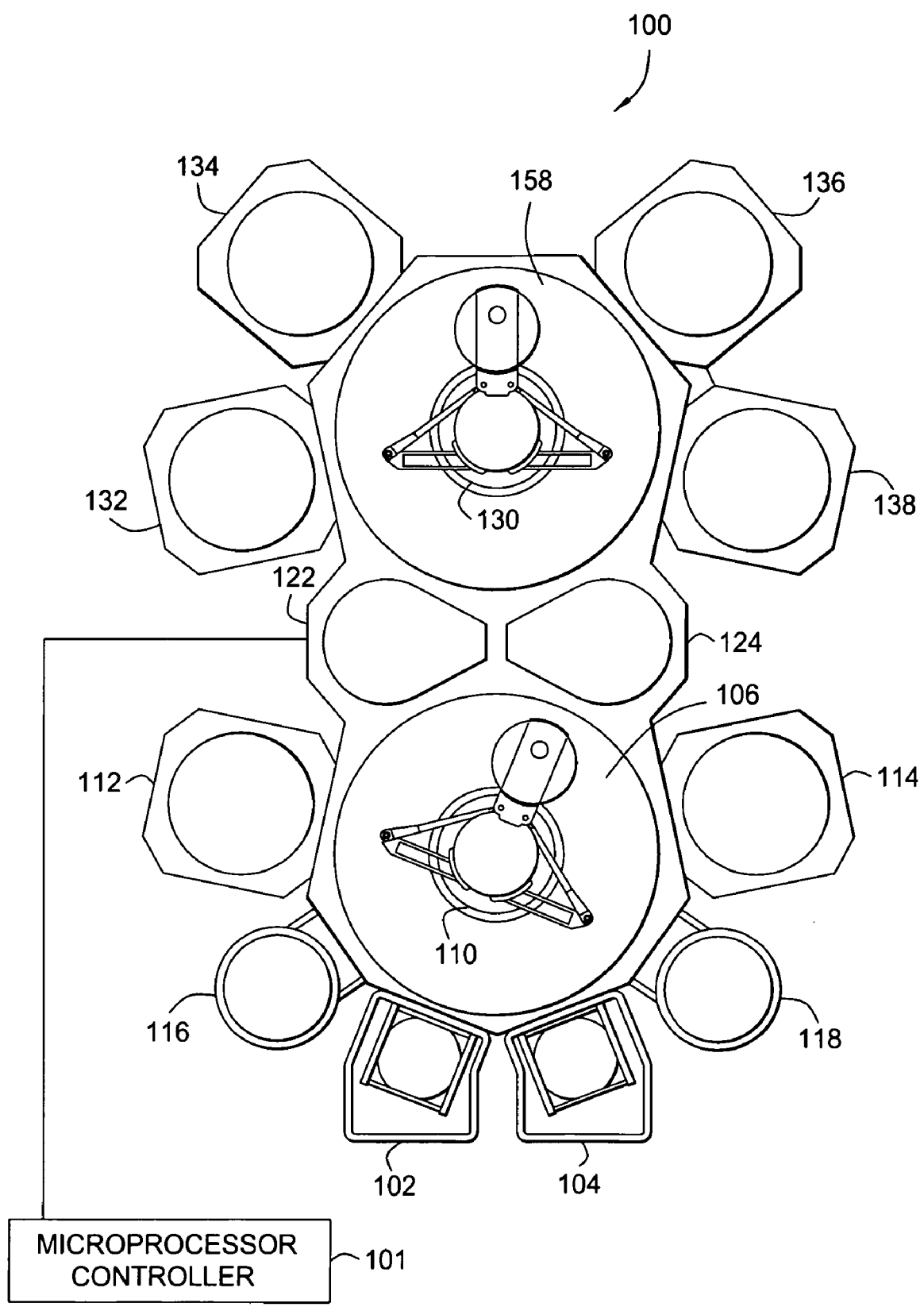
FIG. 1 is a schematic sectional view of an integrated tool for semiconductor processing.

The present invention provides a chamber for physical vapor deposition. FIG. 1 depicts a schematic diagram of a multiple process chamber platform for semiconductor substrate processing that is commercially available as the ENDURA™ processing tool manufactured by Applied Materials, Inc. of Santa Clara, Calif. The processing tool 100 depicted in FIG. 1 contains, for example, four process chambers 132, 134, 136, and 138, including at least one PVD chamber having a radiation shield (not shown) of the present invention, an interior transfer chamber 158, a preclean chamber 122, a cooldown chamber 124, a initial transfer chamber 106, substrate-orienter and degas chambers 118 and 116, and a pair of load lock chambers 102 and 104. The initial transfer chamber 106 is centrally located with respect to the load lock chambers 102 and 104, the substrate orienter and degas chambers 116 and 118, the preclean chamber 122, and the cooldown chamber 124. To effectuate substrate transfer amongst these chambers, the initial transfer chamber 106 contains a first robotic transfer mechanism 110, e.g., a single blade robot (SBR). The substrates are typically carried from storage to the processing tool 100 in a cassette (not shown) that is placed within one of the load lock chambers 102 or 104. The SBR 110 transports the substrates, one at a time, from the cassette to any of the four chambers 112, 114, 116, and 118. Typically, a given substrate is first placed in the substrate orienter and one of the degas chambers 116 and 118, then moved to the preclean chamber 112. The cooldown chamber 114 is generally not used until after the substrate is processed within the process chambers 132, 134, 136, and 138. Individual substrates are carried upon a substrate transport blade that is located at distal ends of a pair of extendible arms of the SBR 110. The transport operation is controlled by a microprocessor controller 101.

The interior transfer chamber 158 is surrounded by, and has access to, the four process chambers 132, 134, 136, and 138, as well as the preclean chamber 122 and the cooldown chamber 124. To effectuate transport of a substrate among the chambers, the interior transfer chamber 158 contains a second transport mechanism 130, e.g., a dual blade robot (DBR). The DBR 130 has a pair of substrate transport blades attached to the distal ends of a pair of extendible arms. In operation, one of the substrate transport blades of the DBR 130 retrieves a substrate from the preclean chamber 122 and carries that substrate to a first stage of processing, for example, physical vapor deposition (PVD) in chamber 132. If the chamber is occupied, the DBR 130 waits until the processing is complete and then exchanges substrates, i.e., removes the processed substrate from the chamber with one blade and inserts a new substrate with a second blade. Once the substrate is processed (i.e., PVD of material upon the substrate), the substrate can then be moved to a second stage of processing, and so on. For each move, the DBR 130 generally has one blade carrying a substrate and one blade empty to execute a substrate exchange. The DBR 130 waits at each chamber until an exchange can be accomplished.

Once processing is complete within the process chambers, the transport mechanism 130 moves the substrate from the process chamber and transports the substrate to the cooldown chamber 122. The substrate is then removed from the cooldown chamber using the first robotic transfer mechanism 110 within the initial transfer chamber 106. Lastly, the substrate is placed in the cassette within one of the load lock chambers, 102 or 104, completing the substrate fabrication process within the integrated tool.

Figure 2:
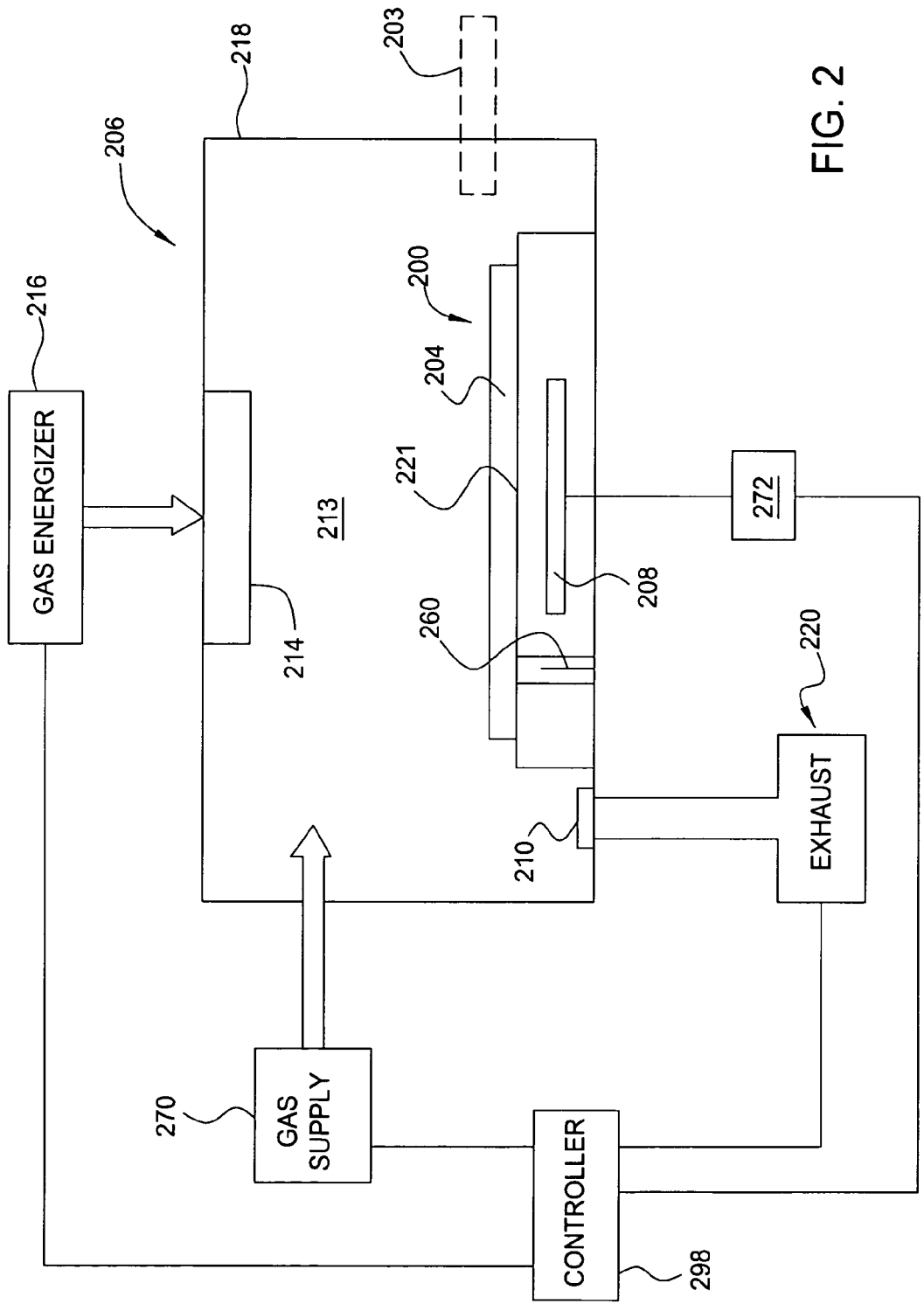
FIG. 2 is a schematic sectional view of an embodiment of a physical vapor deposition chamber.

FIG. 2 is a schematic sectional view of an embodiment of a physical vapor deposition chamber 206 of the present invention. The chamber 206 has an enclosure wall 218, which may include a ceiling, sidewalls, and a bottom wall that enclose a process zone 213. In operation, process gas is introduced into the chamber 206 through a gas supply 270 that includes a process gas source and a gas distributor. The gas distributor may have one or more conduits having one or more gas flow valves and one or more gas outlets around a periphery of the substrate 204 which may be held in the process zone 213 on the substrate support 200 having a substrate receiving surface 221. Alternatively, the gas distributor may comprise a showerhead gas distributor (not shown). Process gas and process byproducts are evacuated from the chamber 206 through a radiation shield 210 to an exhaust 220 which may include an exhaust conduit that receives spent process gas from the process zone 213, a throttle valve to control the pressure of process gas in the chamber 206, and one or more exhaust pumps.

The process gas may be energized to process the substrate 204 by a gas energizer 216 that couples energy to the process gas in the process zone 213 of the chamber 206. In one version, the gas energizer 216 has process electrodes that are powered by a power supply to energize the process gas. The process electrodes optionally include an electrode that is in a wall, such as a sidewall or ceiling of the chamber 206 that may be capacitively coupled to another electrode, such as an electrode 208 in the support 200 below the substrate 204. Additionally, the gas energizer 216 may comprise an antenna comprising one or more inductor coils which may have a circular symmetry about the center of the chamber. In yet another embodiment, the gas energizer 216 may comprise a microwave source and waveguide to activate the process gas by microwave energy in a remote zone upstream from the chamber 206. In a physical vapor deposition chamber 206 adapted to deposit material on a substrate 204, the chamber has a target 214 facing the substrate 204 that is sputtered by the energized gas to deposit material from the target 214 onto the substrate 204.

To process a substrate 204, the process chamber 206 is evacuated and maintained at a predetermined sub-atmospheric pressure. The substrate 204 is then provided on the support 200 by a substrate transport, such as a robot arm 203 and a lift pin 260. The substrate 204 can be held on the support 200 by applying a voltage to the electrode 208 in the support 200, for example via an electrode power supply 272. The gas supply 270 provides a process gas to the chamber 206 and the gas energizer 216 couples RF or microwave energy to the process gas to energize the gas to process the substrate 204.

Effluent generated during the chamber process is exhausted from the chamber 206 by the exhaust 220.

The chamber 206 can be controlled by a controller 298 that comprises program code having instruction sets to operate components to process substrates 204 in the chamber 206, as shown in FIG. 2. The controller 298 can include operating the substrate support 200 and robot arm 203 and lift pins 260 to position a substrate 204 in the chamber 206, the gas supply 270 and flow control valves to set a flow of gas to the chamber 206, the exhaust 220 and throttle valve to maintain a pressure in the chamber 206, and the gas energizer 216 to set a gas energizing power level. Process monitoring and temperature control may also be provided by the controller 294.

Figure 3:
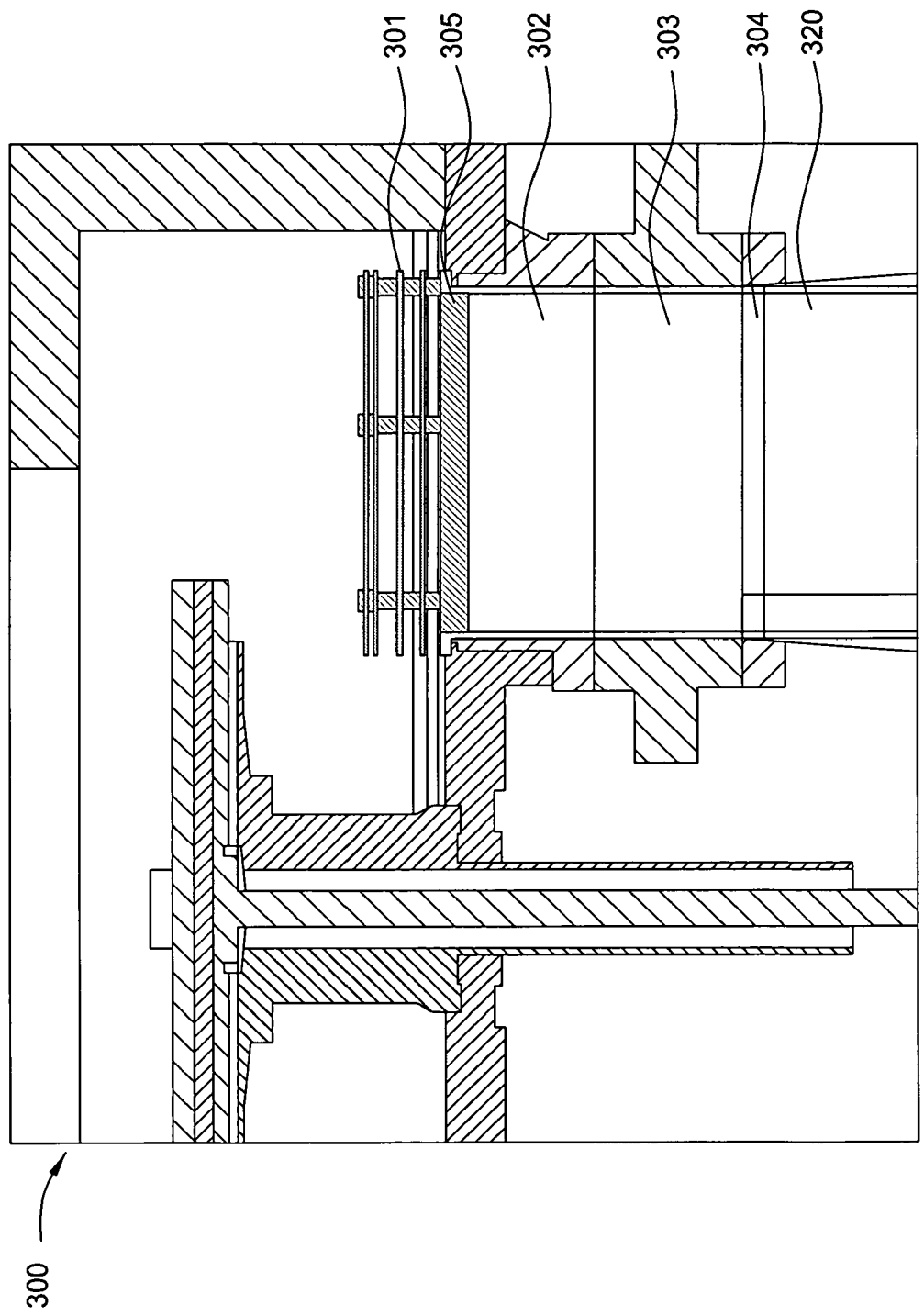
FIG. 3 is a schematic sectional view of a physical vapor deposition chamber with an embodiment of a radiation shield and a cryogenic pump.

FIG. 3 is a schematic sectional view of a physical vapor deposition chamber 300 with an embodiment of a radiation shield 301 and cryogenic pump 304. The radiation shield 301 is mounted in the base of the chamber 300 with the base ring 305 providing conduction between the radiation shield 301 and chamber 300. The chamber body 302 beneath the radiation shield 301 is shielded from the chamber 300 and provides stability for the gate valve 303. The gate valve 303 has the cryogenic pump 304 affixed to its base. The base of exhaust system 320 is attached at the base of the cryogenic pump 304.

Figure 4:
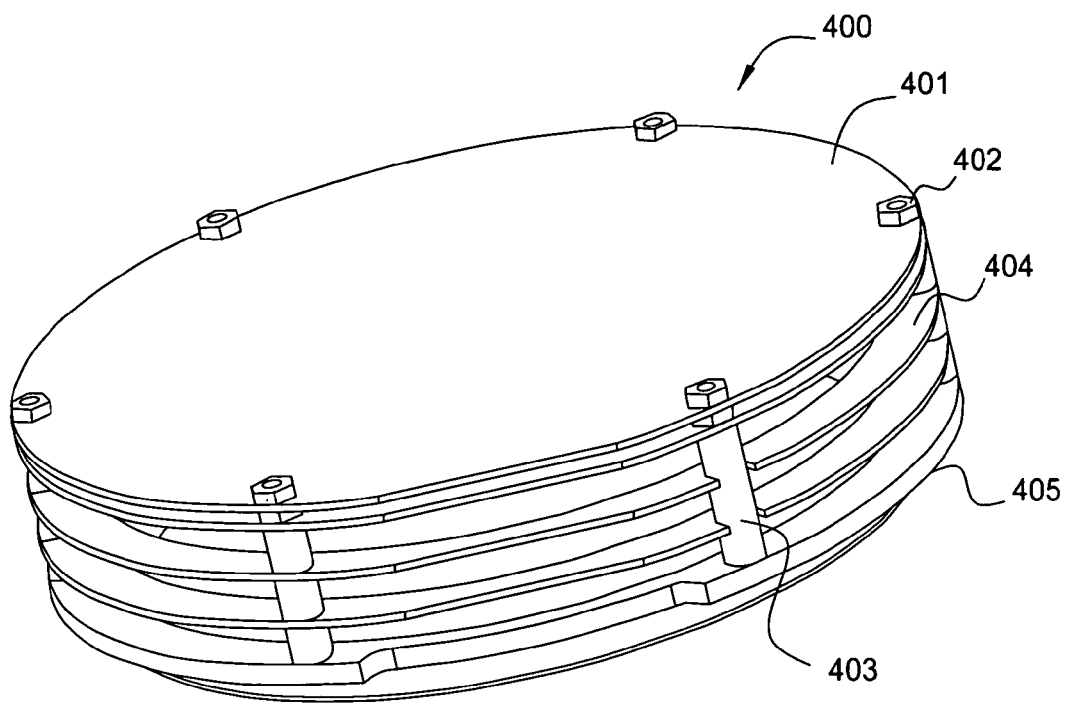
FIG. 4 is a three dimensional view of an embodiment of a radiation shield.

FIG. 4 is a three dimensional view of an embodiment of a radiation shield 400. The upper surface 401 of the shield 400 is attached to the heat conductive posts 403. The posts 403 are also affixed to the chevrons 404 and the base ring 405. Fasteners 402 at the top of the posts 403 primarily provide a compression force to reduce thermal contact resistance at interfaces and also provide stability to the upper portion of the posts 403.

Figure 5:
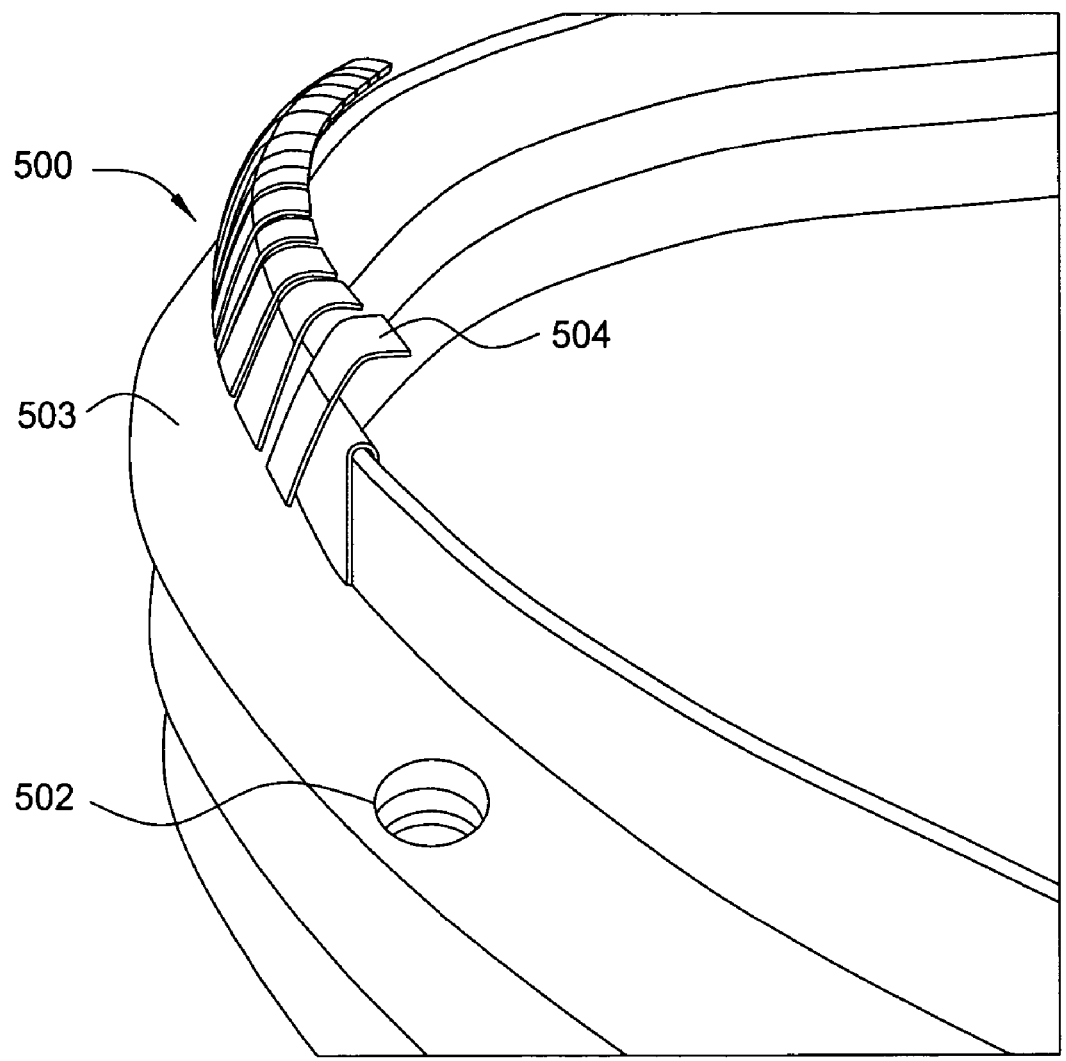
FIG. 5 is a perspective view of an embodiment of sealing member.

FIG. 5 is a perspective view of an embodiment of a base ring 500. The foundation 503 of the base ring 500 has a large contact surface area to provide optimum heat transfer to the bottom surface of the PVD chamber (not shown). The multi-finger gasket 504 encompasses the upper surface of the foundation 503 of the base ring 500. The gasket 504 is a spring-like device and may be made of beryllium copper. The base ring 500 is attached to the posts 403 via fasteners (not shown) inserted through the holes 502.

Figure 6:
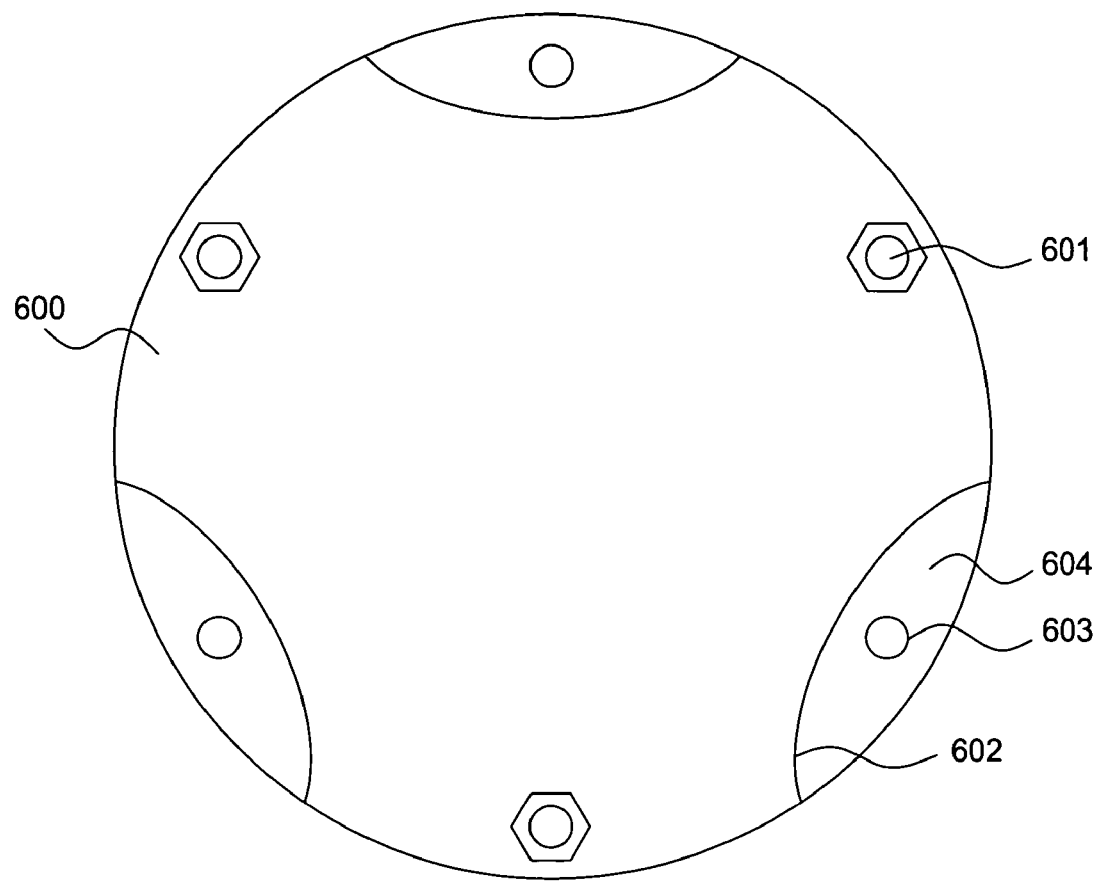
FIG. 6 is a perspective view of an alternative embodiment of an upper surface of a shield.

FIG. 6 is a perspective view of an alternative embodiment of an upper surface 600 of a radiation shield. The upper surface 600 may include aluminum or stainless steel or other material selected for its thermal conductivity. The fasteners 601 connect the upper surface to the posts (not shown) to provide thermal transport to the base of the chamber. The scalloped surface 602 exposes the upper surface of the upper and lower chevrons or intermediate rings 604 in the upper surface and provides a thermal break in the upper surface 600 so that the chevron posts 603 are not in contact with the upper surface 600. The chevron posts 603 provide thermal contact between the upper and lower chevrons 604 and the base of the chamber.

In operation, protecting the cryogenic pump from more than radiated power of about 50 W along the surface of the first stage of the pump is essential to the long term stability and effectiveness of the pump. To test the effectiveness of the radiation shield, a hot aluminum Endura2 300 mm PVD cluster tool, available commercially from Applied Materials of Santa Clara, Calif. was used to perform a bake out sequence. The substrate support was heated to 750 K and the infrared lamps were turned on to 100 percent duty cycle. The cryogenic pump RPM and temperature were monitored. The vacuum integrity was monitored with an MKS open ion source RGA and chamber ion gauges. The typical vacuum level is $5*10^{-6}$ to $1*10^{-5}$ Torr. The chamber walls were maintained at 373 K. Several designs of radiation shields were tested. The results are summarized in Table 1.

TABLE 1

Temperature in Kelvin of radiation shield and the cryogenic pump.

| Shield Design | Radiation Shield Temp. | Chamber Body Temp. | Cryo Port Temp. | Cryo 1st Stage Temp. |
|---|---|---|---|---|
| 1 layer SST | 640 | 373 | 421 | 148 |
| 2 layer SST | 543 | 373 | 378 | 127 |
| 3 layer SST | 502 | 373 | 375 | 125 |
| 2L + Lamp | 540 | 373 | 415 | 120 |
| Al | 473 | 373 | 395 | 115 |
| Al and SST | 633 | 373 | 388 | 100 |

The 1 layer SST is a stainless steel assembly with a single radiation shield. The heat transfer to the cryo $1^{st}$ stage is calculated as 80 W. 2 layer SST is a stainless steel assembly with a second radiation shield. The 3 layer SST is a stainless steel assembly with a third radiation shield. The temperature measurements for the 2 and 3 layer SST assembly indicate that the mathematical models for radiation blocked by the shields did not accurately reflect the chamber heat transfer properties, indicating that indirect heat transfer from the chamber is entering the exhaust assembly and reaching the cryo port. The 2 L and Lamp shield assembly had an electro polished shield placed under lamp 1 to block infrared energy from the direct lamp above the shield as well as two radiation shields. The Al shield was constructed entirely of aluminum. The Al and SST shield was made of a combination of materials in which the radiation shield, supporting studs, and base ring were all aluminum, and the top shield was stainless steel.

Next, additional ways to shield the radiation from the cryogenic pump were tested. Table 2 compares the results of testing of several embodiments.

TABLE 2

Temperature in Kelvin of radiation shield and cryogenic pump.

| Shield Design | Radiation Shield Temp. | Chamber Body Temp. | Cryo Port Temp. | Cryo 1st Stage Temp. |
|---|---|---|---|---|
| Hybrid | 540 | 373 | 415 | 120 |
| Hybrid + IR | 473 | 373 | 390 | 100 |
| Hybrid + 2 IR | 440 | 373 | 390 | 100 |
| Water Cooled | 633 | 373 | 388 | 100 |

The Hybrid design was a combined water cooled assembly and a continuous radiation shield. The Hybrid+IR design was a Hybrid design with an intermediate ring. The Hybrid+2IR design featured two intermediate rings. The water cooled design had a water cooled channel bored through the center of a bar across the center of the exhaust to the cryogenic pump.

Additional testing was performed to test the embodiment illustrated by FIG. 6. The three rods to the upper surface conduct heat from the surface to the base of the chamber and three additional rods support two intermediate rings. This embodiment has minimum thermal resist from the upper surface to the base ring. Using the shield with the beryllium copper multifinger gasket yielded a reduction in upper surface radiation temperature and base ring temperature by about 10 to about 20 percent. The cryopump received less than 50 W.

While the foregoing is directed to embodiments of the present invention, other and further embodiments of the invention may be devised without departing from the basic scope thereof, and the scope thereof is determined by the claims that follow.

The invention claimed is:

1. An apparatus to shield a cryogenic pump in a physical vapor deposition chamber, comprising:
    a physical vapor deposition chamber having an exhaust port;
    a gasket in thermal contact with the physical vapor deposition chamber, wherein the gasket has multiple fingers in contact with the physical vapor deposition chamber;
    a cryogenic pump connected to the exhaust port;
    at least one post in contact with the physical vapor deposition chamber;
    a radiation shield connected at the top of the post; and
    at least one intermediate ring in contact with the post.

2. The apparatus of claim 1, wherein three posts are in contact with the physical deposition chamber.

3. An apparatus to shield a cryogenic pump in a physical vapor deposition chamber, comprising:
    a physical vapor deposition chamber having an exhaust port;
    a gasket in thermal contact with the physical vapor deposition chamber;
    a cryogenic pump connected to the exhaust port;
    at least one post in contact with the physical vapor deposition chamber;
    a radiation shield connected at the top of the post;
    at least one intermediate ring in contact with the post; and
    at least one post in contact with the at least one intermediate ring and the gasket and not with the radiation shield.

4. The apparatus of claim 3, wherein three posts are in contact with the at least one intermediate ring and the gasket.

5. The apparatus of claim 1, wherein the gasket comprises beryllium copper.

6. The apparatus of claim 1, wherein the at least one intermediate ring is two intermediate rings.

7. The apparatus of claim 1, wherein the shield comprises aluminum.

8. An apparatus to shield a cryogenic pump, comprising:
    a cryogenic pump;
    a region upstream from the cryogenic pump;
    a gasket in thermal contact with the region upstream from the cryogenic pump, wherein the gasket has multiple fingers in contact with the region;
    at least one post in contact with the gasket;
    a radiation shield connected at the top of the post; and
    at least one intermediate ring in contact with the post.

9. The apparatus of claim 8, wherein three posts are in contact with the gasket.

10. An apparatus to shield a cryogenic pump, comprising:
    a cryogenic pump;
    a region upstream from the cryogenic pump;
    a gasket in thermal contact with the region upstream from the cryogenic pump;
    at least one post in contact with the gasket;
    a radiation shield connected at the top of the post;
    at least one intermediate ring in contact with the post; and
    at least one post in contact with the at least one intermediate ring and the gasket and not with the radiation shield.

11. The apparatus of claim 10, wherein three posts are in contact with the at least one intermediate ring and the gasket.

12. The apparatus of claim 8, wherein the gasket comprises beryllium copper.

13. The apparatus of claim 8, wherein two intermediate rings are in contact with the post.

14. The apparatus of claim 8, wherein the shield comprises aluminum.

15. An apparatus to shield a cryogenic pump in a physical vapor deposition chamber, comprising:
- a physical vapor deposition chamber having an exhaust port;
- a cryogenic pump connected to the exhaust port;
- a gasket in thermal contact with the physical vapor deposition chamber;
- at least one post in contact with the gasket;
- a radiation shield connected at the top of the post;
- at least one intermediate ring in contact with the post; and
- at least one post in contact with the at least one intermediate ring and the gasket and not with the radiation shield.

16. The apparatus of claim 15, wherein three posts are in contact with the at least one intermediate ring and the gasket.

* * * * *